US012507500B2

(12) United States Patent
Selvamanickam et al.

(10) Patent No.: US 12,507,500 B2
(45) Date of Patent: Dec. 23, 2025

(54) HIGHLY-TEXTURED THIN FILMS

(71) Applicant: University of Houston System, Houston, TX (US)

(72) Inventors: Venkat Selvamanickam, Houston, TX (US); Yongkuan Li, Houston, TX (US); Ying Gao, Mason, OH (US)

(73) Assignee: University of Houston System, Houston, TX (US)

( * ) Notice: Subject to any disclaimer, the term of this patent is extended or adjusted under 35 U.S.C. 154(b) by 1254 days.

(21) Appl. No.: 17/288,828

(22) PCT Filed: Oct. 25, 2019

(86) PCT No.: PCT/US2019/058136
§ 371 (c)(1),
(2) Date: Apr. 26, 2021

(87) PCT Pub. No.: WO2020/086998
PCT Pub. Date: Apr. 30, 2020

(65) Prior Publication Data
US 2021/0359146 A1 Nov. 18, 2021

Related U.S. Application Data

(60) Provisional application No. 62/750,679, filed on Oct. 25, 2018.

(51) Int. Cl.
*H10F 77/169* (2025.01)
*C30B 25/18* (2006.01)
(Continued)

(52) U.S. Cl.
CPC ......... *H10F 77/169* (2025.01); *C30B 25/183* (2013.01); *H01L 21/02293* (2013.01); *H10N 60/0632* (2023.02); *H10N 60/0801* (2023.02)

(58) Field of Classification Search
None
See application file for complete search history.

(56) References Cited

U.S. PATENT DOCUMENTS 5,231,077 A * 7/1993 Sasaki ............... H10N 60/0632
505/703
6,849,580 B2 2/2005 Norton et al.
(Continued)

OTHER PUBLICATIONS

Rathi et al. "High opto-electronic quality n-type single-crystalline-like GaAs thin films on flexible metal substrates" J. Mater. Chem. C 2017, 5, 7919-7926. (Year: 2017).*
(Continued)

*Primary Examiner* — Paul A Wartalowicz
(74) *Attorney, Agent, or Firm* — Blank Rome LLP

(57) ABSTRACT

A superconductor tape and method for fabricating same are disclosed. Embodiments are directed to a superconductor tape including a substrate and a buffer stack. In one embodiment, the buffer stack includes: an Ion Beam-Assisted Deposition (IBAD) template layer above the substrate; a
(Continued)

homo-epitaxial film of MgO or TiN above the IBAD template layer; an epitaxial film of silver above the homo-epitaxial film; and a homo-epitaxial film of LaMnO3 (LMO) above the silver epitaxial film. The superconductor tape also includes a superconductor film above the buffer stack. These and other embodiments achieve a LMO film with substantially improved texture, resulting in a superconductor structure having high critical current and significantly reduced power consumption and cost.

3 Claims, 11 Drawing Sheets

(51) Int. Cl.
*H01L 21/02* (2006.01)
*H10N 60/01* (2023.01)

(56) References Cited

U.S. PATENT DOCUMENTS

| 8,987,736 | B2* | 3/2015 | Goyal | H01L 21/02425 |
| | | | | 257/49 |
| 9,735,318 | B2 | 8/2017 | Matias et al. | |
| 2003/0094598 | A1 | 5/2003 | Storer et al. | |
| 2011/0160066 | A1 | 6/2011 | Aytug et al. | |
| 2014/0249034 | A1* | 9/2014 | Nakayama | H10N 60/0296 |
| | | | | 174/257 |
| 2015/0065351 | A1 | 3/2015 | Wang et al. | |
| 2015/0303347 | A1* | 10/2015 | Boettcher | H01L 31/0693 |
| | | | | 438/491 |
| 2016/0155542 | A1* | 6/2016 | Selvamanickam | |
| | | | | H10N 60/0632 |
| | | | | 174/125.1 |

OTHER PUBLICATIONS

Selvamanickam, et al., "Germanium films with strong in-plane and out-of-plane texture on flexible, randomly textured metal substrates," J. Crystal Growth 311, 4553 (2009).
C. P. Wang, K. B. Do, M. R. Beasley, T. H. Geballe, and R. H. Hammond, "Deposition of in-plane textured MgO on amorphous Si3N4 substrates by ion-beam-assisted deposition and comparisons with ion-beam-assisted deposited yttria-stabilized-zirconia," Appl. Phys. Lett. 71, 2955 (1997); https://doi.org/10.1063/1.120227.
R. Wang, S. Sambandam, G. Majkic, E. Galstyan, V. Selvamanickam, "High mobility single-crystalline-like germanium thin film on flexible, inexpensive substrates", Thin Solid Films 527, 9-15 (2013).
P. Dutta, et al. "Large grained singly-crystalline-like Germanium thin film on flexible Ni-W tape." RSC Advances. 16 pages.
D. Xu, et al. "Influence of CeO2-Cap Layer on the Texture and Critical Current Density of YBCO Film." J Supercond Nov Magn (2012) 25:197-200. DOI 10.1007/s10948-011-1251-0.
Y. Li et al. "Significant texture improvement in single-crystalline-like materials on low-cost flexible metal foils through growth of silver thin films." J Appli Cryst. (2019) 52:898-902. https://doi.org/10.1107/S1600576719007295.
International Search Report dated Mar. 30, 2020, issued in counterpart PCT Application No. PCT/US2019/058136.

* cited by examiner

| RE-Ba-Cu-O |
|---|
| LaMnO$_3$ (LMO) |
| Homo-epitaxial MgO |
| IBAD MgO |
| Metal Substrate |

**FIG. 11
(PRIOR ART)**

| RE-Ba-Cu-O |
|---|
| LaMnO$_3$ (LMO) |
| TiN |
| Ag |
| Homo-epitaxial MgO |
| IBAD MgO |
| Metal Substrate |

FIG. 12

HIGHLY-TEXTURED THIN FILMS

CROSS REFERENCE TO RELATED APPLICATION(S)

This application is a national phase of PCT/US19/58136, filed Oct. 25, 2019, which claims priority to U.S. provisional patent application No. 62/750,679, filed on Oct. 25, 2018, both of which are hereby incorporated herein by reference in their entireties.

GOVERNMENT SPONSORSHIP

This invention was made with government support under DE-EE0006711 and DE-EE0007869 awarded by U.S. Department of Energy. The Government has certain rights in the invention.

FIELD

The embodiments disclosed herein are in the field of thin films. More particularly, the embodiments disclosed herein relate to highly-textured thin films and methods of fabricating same, which, inter alia, achieve a thin film having an in-plane texture of less than 2° which would have highly reduced misorientations between grain boundaries, resulting in superior electronic, opto-electronic, and electrical properties. Embodiments disclosed herein also relate to highly-textured thin films that do not have twin orientations which can adversely affect the above properties.

BACKGROUND

The performance of flexible electronics devices is limited by the quality of amorphous silicon used. For example, the carrier mobility values of amorphous silicon and organic semiconductors used in flexible electronics are about 1-10 $cm^2/Vs$ compared to about 100 $cm^2/Vs$ of polysilicon and about 500 $cm^2/Vs$ of single-crystalline Si. As a result of the low carrier mobility, key performance metrics such as switching speed of thin film transistors (TFTs) fabricated with amorphous Si and organic semiconductors are far below that of TFTs made with crystalline silicon. The efficiency of III-V compound semiconductor solar cells is 37% which is twice as high as that of silicon solar cells but requires a very expensive substrate. Polycrystalline III-V thin film solar cells show much less efficiency than solar cells made on expensive single crystal wafers.

Previously, templates made using Ion Beam-Assisted Deposition (IBAD) have yielded superior quality Ge, Si and GaAs films. IBAD templates have been used to fabricate, for example, epitaxial germanium with a high mobility on inexpensive metal substrates. Also, epitaxial silicon with a hole mobility of 230 $cm^2/Vs$ has been previously demonstrated on epitaxial Ge grown over IBAD templates. Epitaxial GaAs thin films with an electron mobility of 1300 $cm^2/Vs$ have also been grown on epitaxial Ge on IBAD-based substrates. Still, the quality of these materials and devices made with them are not on par with materials grown on single crystal wafers. One reason is the texture of the epitaxial Ge thin film is inferior to that of single crystal Ge wafers. For example, the typical in-plane texture of a 1 μm thick epitaxial Ge film grown on IBAD-based templates is about 6° which is essentially limited by the in-plane texture of about 6° of the underlying buffer films such as $CeO_2$, $LaMnO_3$ and MgO grown on the IBAD template. In comparison, the in-plane texture of a germanium single crystal wafer is substantially less than 1°.

Another advanced thin film material that has been demonstrated on IBAD templates is RE-Ba—Cu—O (REBCO, RE=rare earth) superconductor. The critical current density of REBCO superconductors have been shown to improve with decreasing in-plane texture of buffer layers on IBAD templates. The typical in-plane texture values of about 6° of buffer layers on IBAD templates limits the level of critical current density that can be achieved with REBCO superconductors formed on the underlying buffer layer.

Therefore, there is a need to achieve in-plane texture of thin films much less than 6° on epitaxial thin buffer films on IBAD substrates. Such thin films would have highly reduced misorientations between grain boundaries. Without the reduction, the degree of misorientations can be deleterious to electronic, opto-electronic and electrical properties. Additionally, it is highly desired that such thin films do not have twin orientations which can also adversely affect the properties of the thin films.

Thus, it is desirable to provide a highly-textured thin film and method of making same that are able to overcome the above disadvantages.

These and other advantages of the present invention will become more fully apparent from the detailed description of the invention herein below.

SUMMARY

Embodiments are directed to a film stack comprising a biaxially-textured film comprising a material with an in-plane texture of less than 2° when measured at a thickness of less than 1 μm. The material is selected from the group consisting of silver, germanium, silicon, GaAs, and combinations thereof.

In an embodiment, the biaxially-textured film is substantially free of twin orientations.

Embodiments are also directed to a method for fabricating a film stack. The method comprises: providing a polycrystalline or amorphous substrate; depositing an Ion Beam-Assisted Deposition (IBAD) template layer above the substrate; forming a homo-epitaxial film of MgO or TiN above the IBAD template layer; and forming a film of silver epitaxially above the MgO or TiN film. The silver is biaxially-textured with an in-plane texture of less than 2°.

In an embodiment, the method further comprises annealing the epitaxial silver film.

In an embodiment, the method further comprises forming, above the epitaxial silver film, a film comprising germanium with an in-plane texture of less than 2° when measured at a thickness of less than 1 μm.

In an embodiment, the method further comprises forming, above the epitaxial silver film, a film comprising silicon with an in-plane texture of less than 2° when measured at a thickness of less than 1 μm.

In an embodiment, the method further comprises forming, above the epitaxial silver film, a film comprising GaAs with an in-plane texture of less than 2° when measured at a thickness of less than 1 μm.

Embodiments are further directed to a superconductor tape comprising a substrate and a buffer stack. The buffer stack comprises: an Ion Beam-Assisted Deposition (IBAD) template layer above the substrate; a homo-epitaxial film of MgO or TiN above the IBAD template layer; an epitaxial film of silver above the homo-epitaxial film; and a homo-epitaxial film above the silver epitaxial film. The superconductor tape also comprises a superconductor film above the buffer stack.

In an embodiment, the homo-epitaxial film above the silver epitaxial film is biaxially-textured with an in-plane texture of less than 3°. The homo-epitaxial film above the silver epitaxial film may have an out-of-plane texture of less than 2°.

In an embodiment, the superconductor tape further comprises an epitaxial film of TiN between the silver epitaxial film and the homo-epitaxial film above the silver epitaxial film. The superconductor tape may further comprise an epitaxial film of MgO between the TiN epitaxial film and the homo-epitaxial film above the silver epitaxial film.

In an embodiment, the IBAD template layer comprises MgO or TiN.

In an embodiment, the superconductor film has a critical current density above 5 MA/cm$^2$ at a thickness greater than 1 μm at 77 K, 0 T.

In an embodiment, the homo-epitaxial film above the silver epitaxial film comprises a material selected from the group consisting of LaMnO$_3$ (LMO), CeO$_2$, SrTiO$_3$, LaAlO$_3$, and combinations thereof.

BRIEF DESCRIPTION OF THE DRAWINGS

The foregoing summary, as well as the following detailed description, will be better understood when read in conjunction with the appended drawings. For the purpose of illustration only, there is shown in the drawings certain embodiments. It's understood, however, that the inventive concepts disclosed herein are not limited to the precise arrangements and instrumentalities shown in the figures.

FIG. 11 is a schematic and cross-sectional diagram illustrating a prior art REBCO superconductor tape.

FIG. 12 is a schematic and cross-sectional diagram illustrating a REBCO superconductor tape with improved texture, in accordance with an embodiment.

DETAILED DESCRIPTION

Figures 1A, 1B, 1C:
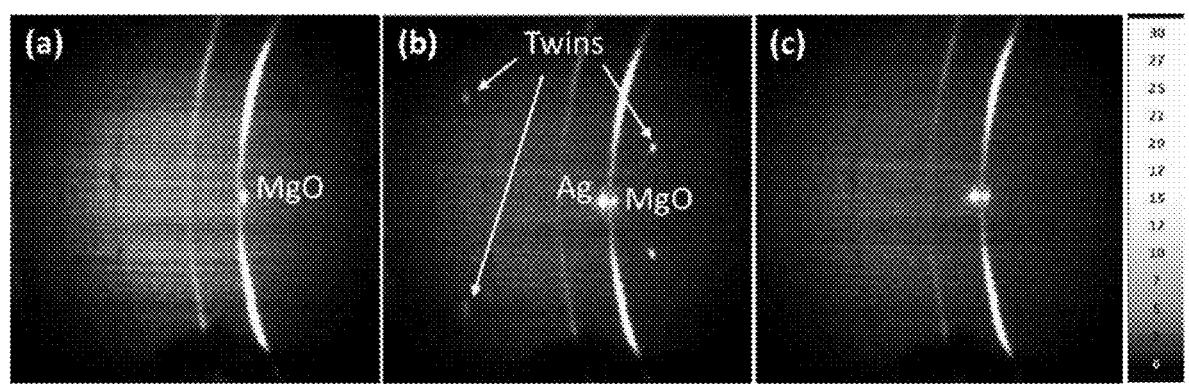
FIGS. 1A-1C are plots illustrating two-dimensional (2D) X-ray Diffraction data from: a) Homo-epitaxial MgO film on an IBAD MgO template on metal substrate; b) epitaxial silver film on the homo-epitaxial MgO; and c) epitaxial silver film after annealing.

It is to be understood that the figures and descriptions of the present invention may have been simplified to illustrate elements that are relevant for a clear understanding of the present embodiments, while eliminating, for purposes of clarity, other elements found in a typical thin film, film stack, or superconductor tape, or typical method of fabricating a thin film, film stack, or superconductor tape. Those of ordinary skill in the art will recognize that other elements may be desirable and/or required in order to implement the present embodiments. However, because such elements are well known in the art, and because they do not facilitate a better understanding of the present embodiments, a discussion of such elements is not provided herein. It is also to be understood that the drawings included herewith only provide diagrammatic representations of the presently preferred structures of the present invention and that structures falling within the scope of the present embodiments may include structures different than those shown in the drawings. Reference will now be made to the drawings wherein like structures are provided with like reference designations.

Before explaining at least one embodiment in detail, it should be understood that the concepts set forth herein are not limited in their application to the construction details or component arrangements set forth in the following description or illustrated in the drawings. It should also be understood that the phraseology and terminology employed herein are merely for descriptive purposes and should not be considered limiting.

It should further be understood that any one of the described features may be used separately or in combination with other features. Other embodiments of devices, systems, methods, features, and advantages described herein will be or become apparent to one with skill in the art upon examining the drawings and the detailed description herein. It's intended that all such additional devices, systems, methods, features, and advantages be protected by the accompanying claims.

For purposes of this disclosure, the terms "film" and "layer" may be used interchangeably.

Thin film manufacturing of advanced materials is widely employed in microelectronics, photovoltaics (PV), solid-state lighting, flat panel displays, magnetic hard drives, optics and optoelectronics. In most of these and other applications, the thin films are deposited on rigid, small-area wafers in batch processes which typically result in a high manufacturing cost. The following examples in photovoltaics and large-area electronics illustrate this challenge.

III-V compound semiconductors (based on GaAs, InGaP, etc.) are utilized in high-efficiency photovoltaics. These films are deposited by epitaxial growth on single crystal wafers such as Ge or GaAs. By far, the highest solar cell efficiencies have been achieved with III-V photovoltaics (PVs): one-sun (1-sun) efficiencies over 37% have been demonstrated. However, because of their high cost, the use of III-V materials in terrestrial applications has been limited to concentrator PVs for the utilities industry. The high cost is mainly due to very expensive Ge or GaAs crystalline wafers which could amount to up to 50% of the total module cost.

The traditional silicon device fabrication platform for thin film transistor manufacturing technologies is too costly and typically yields form factors not adequate for large scale, inexpensive systems. Flexible electronics overcomes these deficiencies. But the performance of amorphous silicon used in flexible electronics is far inferior to that of crystalline silicon used in microelectronics which limits the performance and capability of the devices. For example, the carrier mobility values of amorphous silicon and organic semiconductors used in flexible electronics are about 1-10 $cm^2/Vs$, compared to about 100 $cm^2/Vs$ of polysilicon and about 500 $cm^2/Vs$ of single-crystalline Si. As a result of the low carrier mobility, key performance metrics such as switching speed of thin film transistors (TFTs) fabricated with amorphous Si and organic semiconductors are far below that of TFTs made with crystalline silicon (see, for example, Table 1).

TABLE 1

Comparison of two major technological platforms in semiconductor electronics and photonics

|  | Crystalline Materials | Non-Crystalline Materials |
| --- | --- | --- |
| Substrate | Single crystal | Non-single crystal |
| Cost | High | Low |
| Performance characteristics | Superior | Inferior |
| Versatility | Brittle | Flexible |
| Area | Small | Large |

The inventors have developed technology to fabricate various advanced materials in an epitaxial form by roll-to-roll processing on inexpensive, flexible metal and/or glass substrates. An enabling process to achieve epitaxial thin films on inexpensive, flexible substrates is IBAD. In the IBAD process, materials with rock-salt structures such as MgO are deposited on amorphous layers on any substrate, with simultaneous ion beam bombardment. Under proper conditions, within a first few nanometers of the film, a degree of biaxial crystallographic orientation is achieved. Grains are aligned with respect to each other both in-plane and out-of-plane resembling a single-crystalline-like texture.

The performance of electronic, opto-electronic and electrical devices made using silicon, III-V compound semiconductors and high temperature superconductors are limited by the quality of the thin films that are used. Biaxially-textured films made using IBAD have been demonstrated to fabricate high mobility silicon for flexible electronics, high mobility GaAs for photovoltaics and high critical current density RE-Ba—Cu—O (REBCO, RE=rare earth) superconductor tapes. However the performance of the devices are still limited by the degree of texture of the thin films that are used as templates for growth of the active layers. In this invention, we disclose the fabrication of thin films on inexpensive substrates wherein in-plane texture less than 2° have been achieved in films of thickness less than 1 µm and without any other secondary orientations such as twins (i.e., twin orientations). These highly-textured thin films enable electronic, opto-electronic and electrical devices with performance levels better than that achieved so far. The improved performance levels include, but are not limited to, mobility, carrier life time, conversion efficiency, etc.

In the present disclosure, the inventors disclose a method to convert IBAD-based templates with in-plane texture of about 6° to epitaxial thin films with in-plane texture less than 2° while avoiding twin orientations. The inventors also disclose epitaxial germanium of thickness less than 1 µm grown on such films with in-plane texture less than 2°. Such a high-quality Ge can be now used to fabricate superior quality Si and III-V devices for electronics (of, for example, flexible type) and solar cells. The highly-textured thin films without twin orientations can also be used to make superconductor tapes with even higher critical current density.

Polycrystalline or amorphous substrates are coated with a biaxially-textured film of a material of rock-salt-like structure such as MgO or TiN. A homo-epitaxial film of MgO or TiN is then grown on the IBAD film. In an embodiment, a film of silver is then grown epitaxially on the MgO or TiN layer. In one example, the silver film is grown by magnetron sputtering at 500° C., and a working pressure around $4\times10^{-3}$ Torr for 15 minutes to a typical film thickness of 330 nm. The epitaxial silver film is then annealed in a forming gas atmosphere at 700° C. for 2 hours.

FIGS. 1A-1C, by way of example only, are plots illustrating two-dimensional (2D) X-ray Diffraction data from: a) Homo-epitaxial MgO film on an IBAD MgO template on metal substrate; b) epitaxial silver film on the homo-epitaxial MgO; and c) epitaxial silver film after annealing. Specifically, FIGS. 1A-1C illustrate plots of a two-dimensional (2D) X-ray Diffraction (XRD) of the film before silver deposition (FIG. 1A), after silver deposition (FIG. 1B) and after annealing the silver film (FIG. 1C). FIG. 1A shows only an aligned peak of MgO (200) whereas FIGS. 1B and 1C show presence of Ag (200) peak indicating that the silver film is highly-aligned out-of-plane. But FIG. 1B also shows the presence of twins of silver. Such twins can be deleterious to performance of materials grown on this layer. The inventors discovered that annealing the silver film at 700° C. post deposition effectively removes the twin orientations while not affecting the primary (200) texture of the silver film as seen in FIG. 1C.

Figure 2:
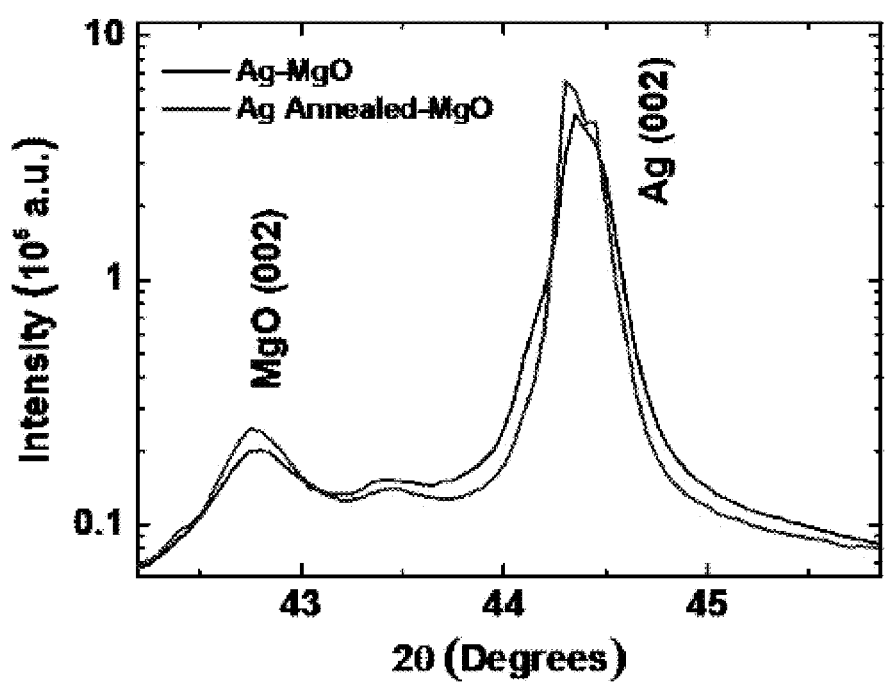
FIG. 2 is a plot illustrating an X-ray Diffraction scan of an annealed epitaxial silver film on an IBAD MgO template.

FIG. 2, by way of example only, is a plot illustrating an X-ray Diffraction scan of an annealed epitaxial silver film on an IBAD MgO template. Specifically, FIG. 2 shows a theta-2theta scan of an annealed silver film on IBAD MgO template. The peak intensity is significantly high, i.e., about 20 times the peak intensity of the MgO film.

The out-of-plane texture values were quantified by rocking-curve measurements of the (002) peaks of MgO and Ag and the results are shown in Table 2. As seen in Table 2, the out-of-plane texture of the Ag is about 0.56° which is an improvement over the out-of-plane texture of about 1.6° of the underlying MgO layer.

TABLE 2

Out-of-plane texture values of Ag and MgO obtained from XRD rocking curves of Ag and MgO peaks of Ag films grown on IBAD MgO templates before and after annealing

| $\Delta\omega(°)$ | Ag/MgO/IBAD MgO | Annealed Ag/MgO/IBAD MgO |
| --- | --- | --- |
| Ag | 0.56 | 0.56 |
| MgO | 1.62 | 1.66 |

Figures 3A, 3B, 3C:
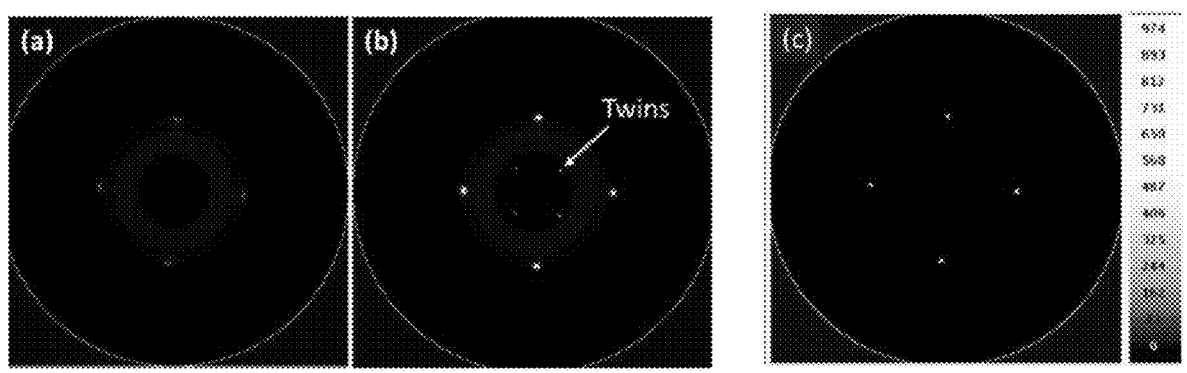
FIGS. 3A-3C are plots illustrating (220) XRD polefigures of: a) Homo-epitaxial MgO film on an IBAD MgO template on a metal substrate; b) epitaxial silver film on the homo-epitaxial MgO; and c) epitaxial silver film after annealing.

FIGS. 3A-3C, by way of example only, are plots illustrating (220) XRD polefigures of: a) Homo-epitaxial MgO film on an IBAD MgO template on a metal substrate; b) epitaxial silver film on the homo-epitaxial MgO; and c) epitaxial silver film after annealing. In-plane texture of the MgO and Ag films is measured by (220) polefigures of the samples. FIGS. 3A-3C exhibit (220) polefigures of the film before silver deposition (FIG. 3A), after silver deposition (FIG. 3B) and after annealing the silver film (FIG. 3C). A four-fold symmetry is observed in both the MgO and silver films indicative of strong in-plane texture. FIG. 3B however reveals another set of four weak peaks at lower khi angles (~19°) and at phi angles 45° to the strong primary peaks. These weak peaks arise from twins in the silver film. After annealing though, the peaks corresponding to the twins disappear as shown in FIG. 3C.

The in-plane texture values were quantified by phi-scan measurements from the polefigures shown in FIGS. 3A-3C and summarized in Table 3. As seen in Table 3, the in-plane texture of the Ag film decreases substantially to about 2° from the higher in-plane texture spread of about 6° of the MgO film. Interestingly, after annealing, the in-plane texture of the silver film decreases even further to less than 1° as shown in Table 3. Such a sharp degree of in-plane texture in the silver film that is less than 1 μm in thickness is remarkably better than the in-plane texture of any other biaxially-textured films grown on IBAD templates.

TABLE 3

In-plane texture values of Ag and MgO obtained from phi scans of Ag and MgO peaks of Ag films grown on IBAD MgO templates before and after annealing

| $\Delta\phi(°)$ | Ag/MgO/IBAD MgO | Annealed Ag/MgO/IBAD MgO |
|---|---|---|
| Ag (220) | 2.07 | 0.91 |
| MgO (220) | 6.33 | 6.33 |

Substantial improvements in the texture of silver films have been observed in silver films hetero-epitaxially grown on IBAD TiN templates. Homo-epitaxial TiN was grown on IBAD TiN film at 700° C. using a titanium target in an atmosphere of argon and nitrogen. Silver was then grown on the TiN film at 500° C. in forming gas (mixture of argon and hydrogen) for 15 minutes. The film was annealed at 700° C. for two hours in an atmosphere of forming gas. The forming gas employed during growth and annealing was argon-hydrogen mixture.

Figures 4A, 4B, 4C:
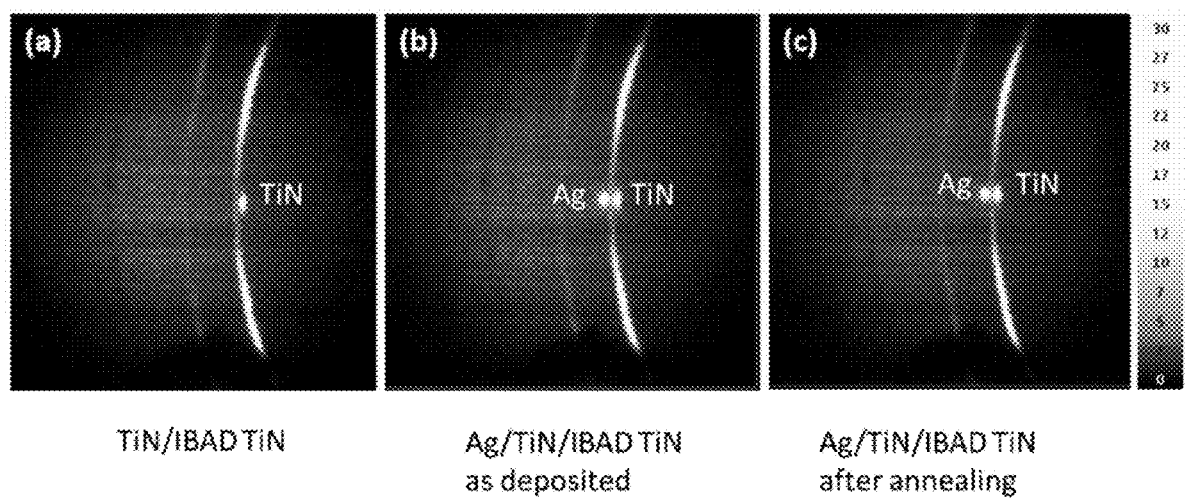
FIGS. 4A-4C are plots illustrating 2D X-ray Diffraction data from: a) Homo-epitaxial TiN film on an IBAD TiN template on metal substrate; b) epitaxial silver film on the homo-epitaxial TiN; and c) epitaxial silver film after annealing.

FIGS. 4A-4C, by way of example only, are plots illustrating 2D X-ray Diffraction data from: a) Homo-epitaxial TiN film on an IBAD TiN template on metal substrate; b) epitaxial silver film on the homo-epitaxial TiN; and c) epitaxial silver film after annealing. Specifically, FIGS. 4A-4C illustrate plots of a 2D X-ray Diffraction (XRD) of the film before silver deposition (FIG. 4A), after silver deposition (FIG. 4B) and after annealing the silver film (FIG. 4C). FIG. 4A shows only an aligned peak of TiN (200) whereas FIGS. 4B and 4C show presence of TiN (200) peak indicating that the silver film is highly-aligned out-of-plane. Unlike the case of Ag on MgO, Ag on TiN does not show presence of twins even before annealing.

Figure 5:
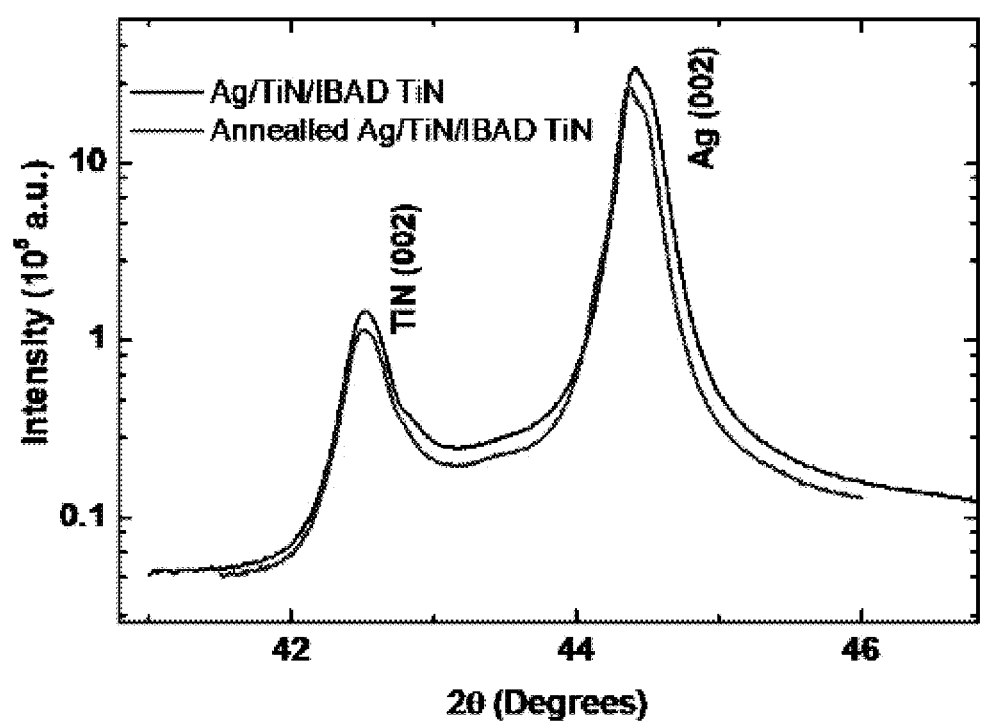
FIG. 5 is a plot illustrating an X-ray Diffraction scan of an annealed epitaxial silver film on an IBAD TiN template.

FIG. 5, by way of example only, is a plot illustrating an X-ray Diffraction scan of an annealed epitaxial silver film on an IBAD TiN template. Specifically, FIG. 5 shows a theta-2theta scan of an annealed silver film on IBAD TiN template. The peak intensity is significantly high, i.e., about 20 times the peak intensity of the TiN film.

The out-of-plane texture values were quantified by rocking-curve measurements of the (002) peaks of TiN and Ag and the results are shown in Table 4. As seen in Table 4, the out-of-plane texture of the Ag is about 0.56° which is an improvement over the out-of-plane texture of about 1.5° of the underlying TiN layer.

TABLE 4

Out-of-plane texture values of Ag and TiN obtained from XRD rocking curves of Ag and TiN peaks of Ag films grown on IBAD TiN templates before and after annealing

| $\Delta\omega(°)$ | Ag/TiN/IBAD TiN | Annealed Ag/TiN/IBAD TiN |
|---|---|---|
| Ag | 0.56 | 0.57 |
| TiN | 1.52 | 1.62 |

Figures 6A, 6B, 6C:
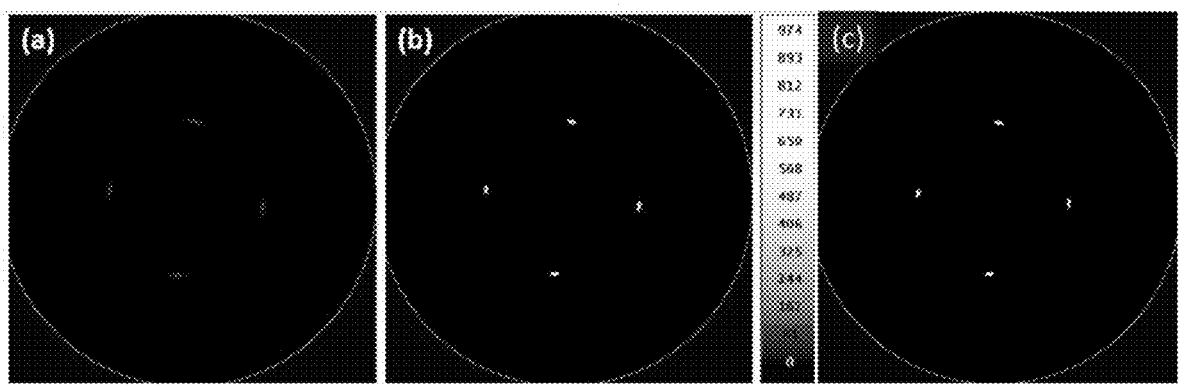
FIGS. 6A-6C are plots illustrating (220) XRD polefigures of: a) Homo-epitaxial TiN film on an IBAD TiN template on a metal substrate; b) epitaxial silver film on the homo-epitaxial TiN; and c) epitaxial silver film after annealing.

FIGS. 6A-6C, by way of example only, are plots illustrating (220) XRD polefigures of: a) Homo-epitaxial TiN film on an IBAD TiN template on a metal substrate; b) epitaxial silver film on the homo-epitaxial TiN; and c) epitaxial silver film after annealing. In-plane texture of the TiN and Ag films is measured by (220) polefigures of the samples. FIGS. 6A-6C exhibit (220) polefigures of the film before silver deposition (FIG. 6A), after silver deposition (FIG. 6B) and after annealing the silver film (FIG. 6C). A four-fold symmetry is observed in both the TiN and silver films indicative of strong in-plane texture. Unlike the case of Ag on MgO, Ag on TiN does not show presence of twins even before annealing.

The in-plane texture values were quantified by phi-scan measurements from the polefigures shown in FIGS. 6A-6C and summarized in Table 5. As seen in Table 5, the in-plane texture of the Ag film decreases substantially to about 2° from the higher in-plane texture spread of about 9° of the TiN film. This margin of improvement is even better than that observed in Ag film on MgO template. However, there is no noticeable improvement in the in-plane texture after annealing the Ag film.

TABLE 5

In-plane texture values of Ag and TiN obtained from phi scans of Ag and TiN peaks of Ag films grown on IBAD TiN templates before and after annealing

| $\Delta\phi(°)$ | Ag/TiN/IBAD TiN | Annealed Ag/TiN/IBAD TiN |
|---|---|---|
| Ag (220) | 2.25 | 2.16 |
| TiN (220) | 9.42 | 9.49 |

The improvement in texture is observed also in films with better quality TiN. As shown in Table 6, the in-plane texture and out-of-plane texture improve from 6.32° and 1.34° in the TiN film to 1.67° and 0.62° in the Ag film.

TABLE 6

$\Delta\phi$ and $\Delta\omega$ values of the Ag and TiN layers on IBAD TiN

| Film XRD Peak | $\Delta\phi(°)$ | Film XRD Peak | $\Delta\omega(°)$ |
|---|---|---|---|
| TiN (220) | 6.32 | TiN (002) | 1.34 |
| Ag (220) | 1.67 | Ag (002) | 0.62 |

Figure 7:
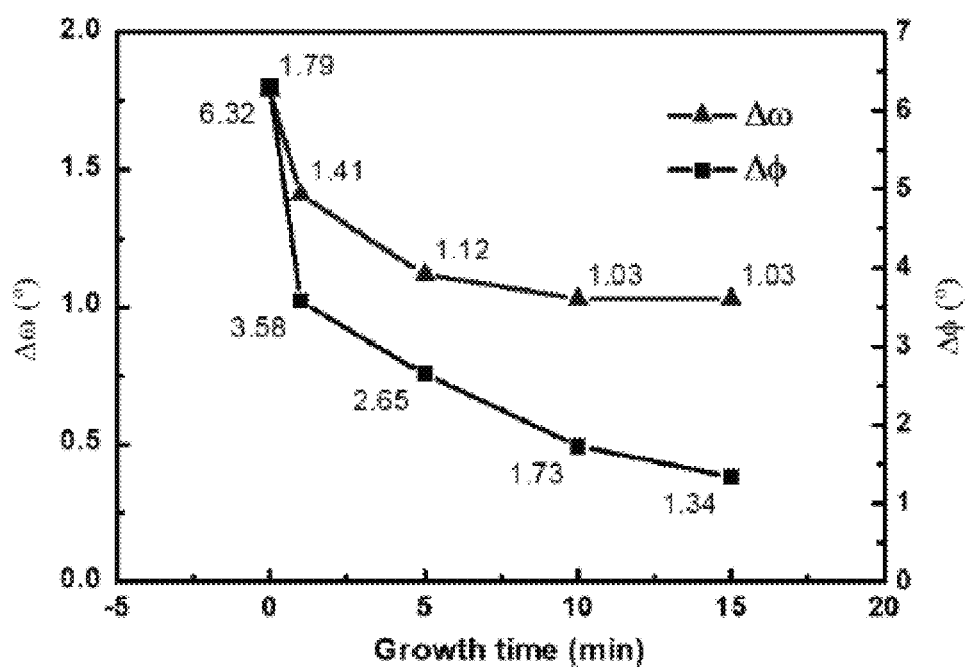
FIG. 7 is a plot illustrating texture values versus growth time of Ag on an IBAD TiN substrate. The data with zero growth time belongs to the underlying TiN layer.

FIG. 7, by way of example only, is a plot illustrating texture values versus growth time of Ag on an IBAD TiN substrate. The data with zero growth time belongs to the underlying TiN layer. FIG. 7 shows the improvement of in-plane and out-of-plane texture with increasing thickness of silver films epitaxially grown on TiN on IBAD TiN. It is also seen from the figure that starting from an in-plane texture of 6.32° of the TiN layer, the in-plane texture of the silver film improves to 2.65° within 5 minutes of deposition and to 1.73° within 10 minutes and 1.34° within 15 minutes. The thickness of the silver film corresponding to a deposition time of 10 min is 220 nm.

Next, Ge film was epitaxially grown on the Ag/TiN layer. Intermediate buffer layers of NiSi2/TiN were epitaxially grown on the Ag/TiN layer before deposition of the Ge film. $NiSi_2$ was sputter deposited in a forming gas atmosphere (such as argon-hydrogen mixture) at 550° C. to a thickness of ~330 nm. The Ge thin film was sputter deposited in a forming gas atmosphere (such as argon-hydrogen mixture) at 525° C. to a thickness of ~200 nm.

It can be seen in Table 7 and Table 8 that the in-plane and out-of-plane texture of the Ge layer are largely improved with the Ag buffer layer.

TABLE 7

$\Delta\varphi$ and $\Delta\omega$ values of the Ge/NiSi$_2$/TiN/Ag/MgO/IBAD MgO sample. Data from a reference sample without Ag film in the buffer stack is included for comparison

| Film in Multilayer Structure | In-Plane Texture of Films in Ge/NiSi$_2$/ TiN/MgO ($\Delta\varphi 2$)(°) | In-Plane Texture of Films in Ge/NiSi$_2$/ TiN/Ag/MgO ($\Delta\varphi 1$)(°) | Improvement in In-Plane Texture [($\Delta\varphi 1 - \Delta\varphi 2$)/ $\Delta\varphi 2$] (%) |
|---|---|---|---|
| Ge (220) | 4.53 | 2.48 | −45.3% |
| NiSi$_2$ (220) | 4.54 | 2.20 | −51.5% |
| TiN (220) | 5.32 | 1.81 | −66.0% |
| Ag (220) | n/a | 1.20 | −81.0% (to MgO) |
| MgO (220) | 6.33 | 6.33 | |

TABLE 8

$\Delta\varphi$ and $\Delta\omega$ values of the Ge/NiSi$_2$/TiN/Ag/MgO/IBAD MgO sample. Data from a reference sample without Ag film in the buffer stack is included for comparison

| Film in Multilayer Structure | Out-of-Plane Texture of Films in Ge/NiSi$_2$/ TiN/MgO ($\Delta\omega 2$)(°) | Out-of-Plane Texture of Films in Ge/NiSi$_2$/ TiN/Ag/MgO ($\Delta\omega 1$)(°) | Improvement in Out-of-Plane Texture [($\Delta\omega 1 - \Delta\omega 2$)/ $\Delta\omega 2$] (%) |
|---|---|---|---|
| Ge | 1.98 | 1.44 | −27.2% |
| NiSi$_2$ | 1.54 | 1.36 | −13.5% |
| TiN | 1.07 | 0.90 | −15.9% |
| Ag | n/a | 0.52 | |
| MgO | | | |

Embodiments are directed to a film stack comprising a biaxially-textured film comprising a material with an in-plane texture of less than 2° when measured at a thickness of less than 1 µm. The material is selected from the group consisting of silver, germanium, silicon, GaAs, and combinations thereof.

In an embodiment, the biaxially-textured film is substantially free of twin orientations.

Figure 8:
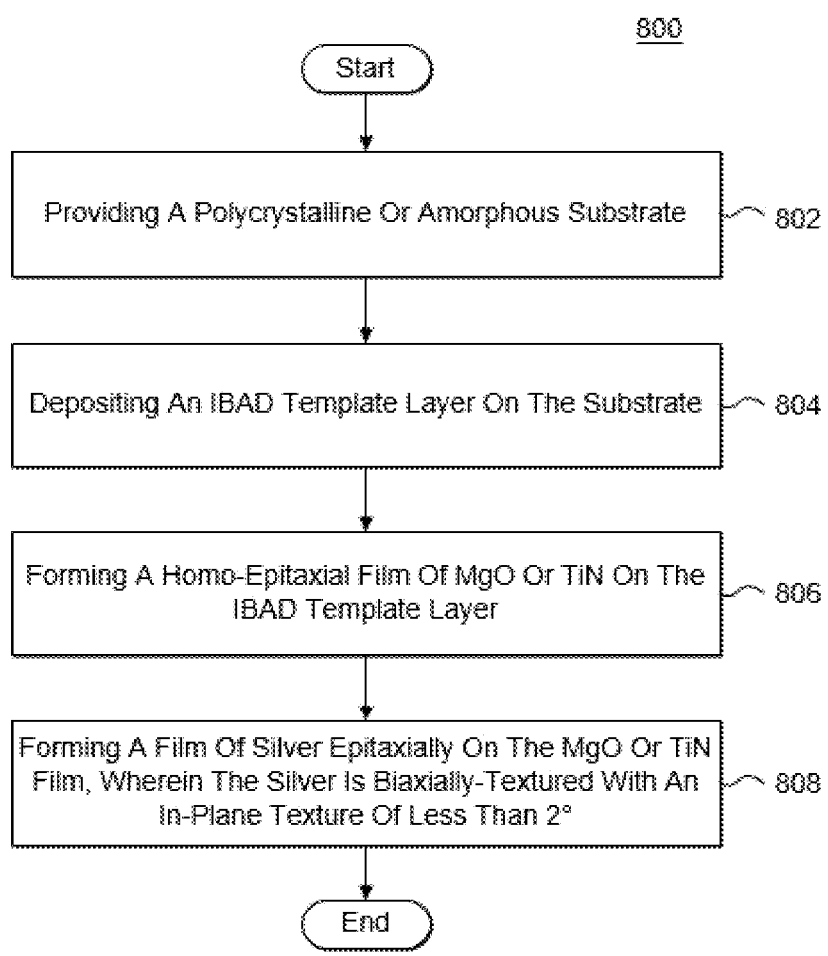
FIG. 8 is a flowchart illustrating an embodiment of a method of fabricating a film stack, in accordance with an embodiment.

By way of example only, FIG. 8 is a flowchart illustrating an embodiment of a method 800 of fabricating a film stack. In an embodiment, the method 800 comprises providing a polycrystalline or amorphous substrate (block 802); depositing an Ion Beam-Assisted Deposition (IBAD) template layer on the substrate (block 804); forming a homo-epitaxial film of MgO or TiN on the IBAD template layer (block 806); and forming a film of silver epitaxially on the MgO or TiN film, wherein the silver is biaxially-textured with an in-plane texture of less than 2° (block 808). In an embodiment, the method further comprises annealing the epitaxial silver film. In another embodiment, the method further comprises forming, on the epitaxial silver film, a film comprising germanium with an in-plane texture of less than 2° when measured at a thickness of less than 1 µm. In yet another embodiment, the method further comprises forming, on the epitaxial silver film, a film comprising silicon with an in-plane texture of less than 2° when measured at a thickness of less than 1 µm. In a further embodiment, the method further comprises forming, on the epitaxial silver film, a film comprising GaAs with an in-plane texture of less than 2° when measured at a thickness of less than 1 µm.

Figure 9:
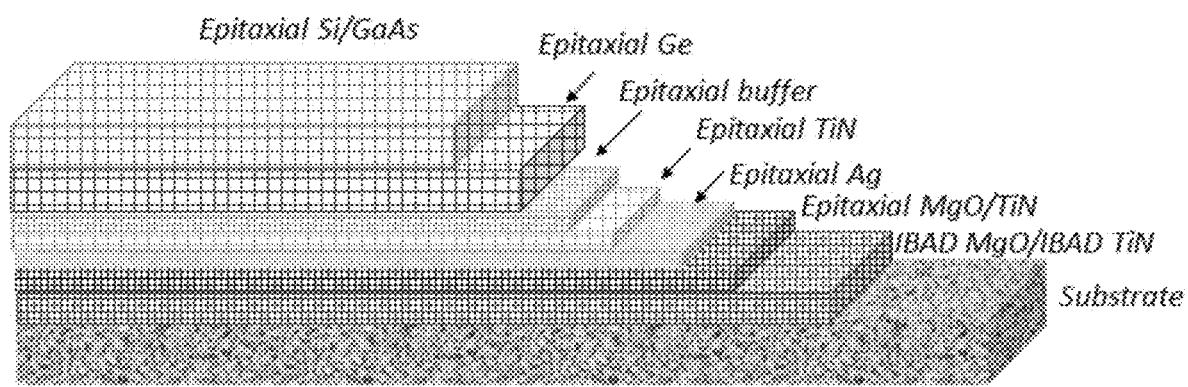
FIG. 9 is a perspective schematic and cross-sectional diagram illustrating a film stack, in accordance with an embodiment.

FIG. 9, by way of example only, is a perspective schematic and cross-sectional diagram illustrating a film stack, in accordance with an embodiment. In this figure/embodiment, epitaxial Si or epitaxial GaAs is formed on epitaxial Ge which is formed subsequent to the formation of a homo-epitaxial film of MgO or TiN on the IBAD template layer, and the formation of a film of silver epitaxially on the MgO or TiN film (wherein the silver is biaxially-textured with an in-plane texture of less than 2°).

Figure 10:
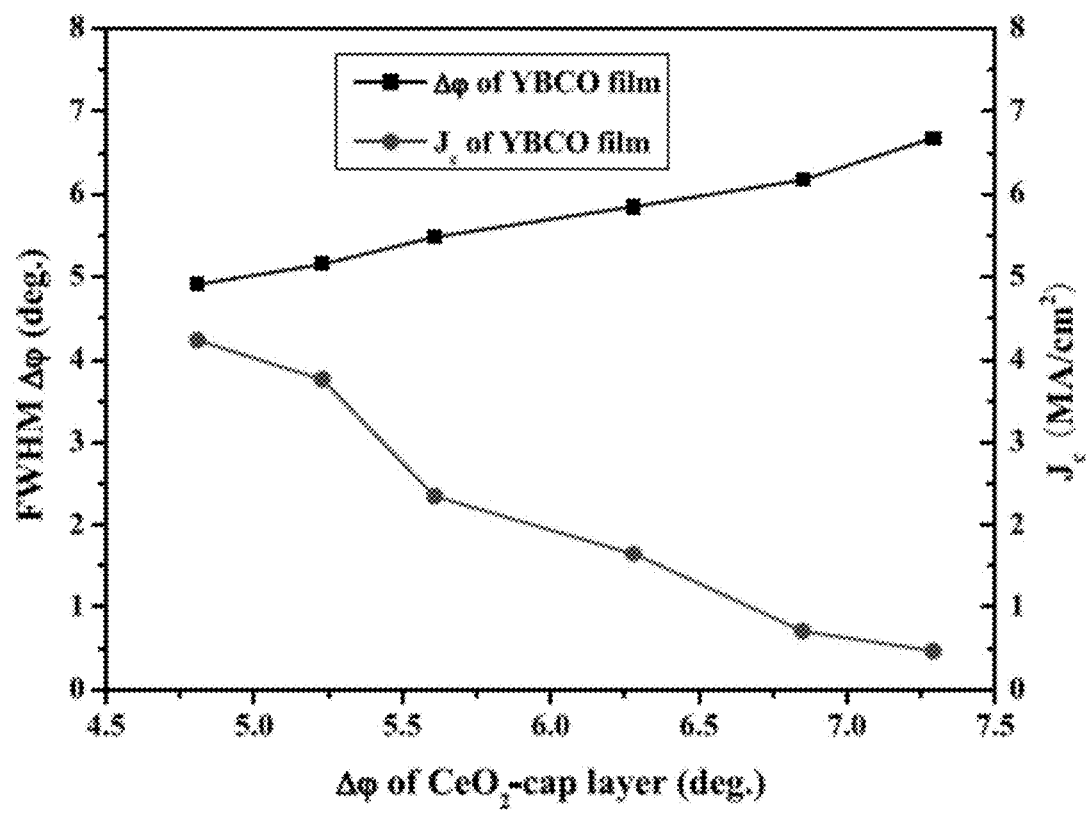
FIG. 10 is a plot illustrating the dependence of in-plane texture and critical current density of a YBCO film grown on a CeO$_2$ buffer layer on the in-plane texture of the CeO$_2$ buffer layer, in accordance with a prior art structure.

This disclosure can be applied to improved buffer layers for high temperature superconductor (HTS) tapes as well. It is well known that the critical current density of RE-Ba—Cu—O (REBCO, RE=rare earth) HTS tapes improve with better out-of-plane and in-plane texture of the REBCO film which in turns depends on the in-plane texture of the buffer layer. FIG. 10 is a plot illustrating the dependence of in-plane texture and critical current density of a YBCO film grown on a $CeO_2$ buffer layer on the in-plane texture of the $CeO_2$ buffer layer, in accordance with a prior art structure as described in "*Influence of CeO$_2$-Cap Layer on the Texture and Critical Current Density of YBCO Film*", Xu et al. *J Supercond Nov Magn* (2012) 25: 197-200). As shown in FIG. 10, as the in-plane texture ($\Delta\varphi$) of the $CeO_2$ buffer layer improves from 7.3° to 4.7°, the in-plane texture of the REBCO (RE=Y in this example) improves from 6.7° to 5°. Correspondingly, the critical current density ($J_c$) of the film increases from 0.25 MA/cm$^2$ to 4.2 MA/cm$^2$.

The in-plane texture of buffer layers used for REBCO superconductor tapes is typically 6-7°. However, in an embodiment, when the in-plane texture of these buffer layers are reduced to less than 3°, the critical current of the REBCO tapes is increased significantly. With a higher critical current, cost of superconductor tapes ($/kA-m) can be significantly reduced for wider market use.

FIG. 11 is a schematic and cross-sectional diagram illustrating a prior art REBCO superconductor tape. The figure shows the architecture of a REBCO tape fabricated with a standard buffer layer of homo-epitaxial MgO and LaMnO$_3$ (LMO).

As shown in Table 9 below, the out-of-plane texture values of the MgO and LMO layers in this structure are 2.3° and 3.4°. The in-plane texture values of the MgO and LMO layers in this structure are 6.4° and 6.6°. In comparison, FIG. 12 is a schematic and cross-sectional diagram illustrating a REBCO superconductor tape with improved texture, in accordance with an embodiment. As shown in FIG. 12, the superconductor tape comprises the addition of epitaxial layers of Ag and TiN on the homo-epitaxial MgO layer, followed by growth of the LMO layer. With this configuration, the out-of-plane and in-plane texture values of the LMO layer have been sharply improved to 1.7° and 2.8° respectively. This is a factor of approximately 2.0 improvement in the out-of-plane texture and a factor of approximately 2.3 improvement in the in-plane texture of the LMO layer. Such a substantially improved texture of the LMO buffer leads to a significant enhancement of the critical current of REBCO tapes incorporating this configuration.

TABLE 9

Out-of-plane and in-plane textures of buffer layers made using traditional MgO and LMO and out-of-plane and in-plane textures of buffer layers incorporating Ag and TiN intermediate layers.

|  | $\Delta\omega(°)$ | $\Delta\varphi(°)$ |
|---|---|---|
| Traditional LMO | 3.4 | 6.6 |
| LMO/MgO/TiN/Ag/Traditional MgO | 1.7 | 2.8 |
| MgO/TiN/Ag/Traditional MgO | 1.1 | 1.85 |
| TiN/Ag/Traditional MgO | 0.8 | 1.7 |
| Traditional MgO | 2.3 | 6.4 |

It is to be noted that the modified REBCO tape architecture shown in the schematic of FIG. 12 is only an example. Alternatives to the structure include use of IBAD TiN instead of IBAD MgO, homo-epi TiN instead of homo-epi MgO, and/or insertion of an epitaxial MgO layer between the TiN and LMO layers.

Embodiments are further directed to a superconductor tape comprising a substrate and a buffer stack. The buffer stack comprises: an Ion Beam-Assisted Deposition (IBAD) template layer above the substrate; a homo-epitaxial film of MgO or TiN above the IBAD template layer; an epitaxial film of silver above the homo-epitaxial film; and a homo-epitaxial film above the silver epitaxial film. The superconductor tape also comprises a superconductor film above the buffer stack.

In an embodiment, the homo-epitaxial film above the silver epitaxial film is biaxially-textured with an in-plane texture of less than 3°. The homo-epitaxial film above the silver epitaxial film may have an out-of-plane texture of less than 2°.

In an embodiment, the superconductor tape further comprises an epitaxial film of TiN between the silver epitaxial film and the homo-epitaxial film above the silver epitaxial film. The superconductor tape may further comprise an epitaxial film of MgO between the TiN epitaxial film and the homo-epitaxial film above the silver epitaxial film.

In an embodiment, the IBAD template layer comprises MgO or TiN.

In an embodiment, the superconductor film has a critical current density above 5 MA/cm$^2$ at a thickness greater than 1 μm at 77 K, 0 T.

In an embodiment, the homo-epitaxial film above the silver epitaxial film comprises a material selected from the group consisting of LaMnO$_3$ (LMO), CeO$_2$, SrTiO$_3$, LaAlO$_3$, and combinations thereof.

Although embodiments are described above with reference to employing LMO as the homo-epitaxial film, the homo-epitaxial film described in any of the above embodiments may alternatively comprise other homo-epitaxial film(s) such as CeO$_2$, SrTiO$_3$, LaAlO$_3$. Such alternatives are considered to be within the spirit and scope of the present invention, and may therefore utilize the advantages of the configurations and embodiments described above.

The method steps in any of the embodiments described herein are not restricted to being performed in any particular order. Also, structures mentioned in any of the method embodiments may utilize structures mentioned in any of the device embodiments. Such structures may be described in detail with respect to the device embodiments only but are applicable to any of the method embodiments.

Features in any of the embodiments described above may be employed in combination with features in other embodiments described above, such combinations are considered to be within the spirit and scope of the present invention.

The contemplated modifications and variations specifically mentioned above are considered to be within the spirit and scope of the present invention.

It's understood that the above description is intended to be illustrative, and not restrictive. The material has been presented to enable any person skilled in the art to make and use the concepts described herein, and is provided in the context of particular embodiments, variations of which will be readily apparent to those skilled in the art (e.g., some of the disclosed embodiments may be used in combination with each other). Many other embodiments will be apparent to those of skill in the art upon reviewing the above description. The scope of the embodiments herein therefore should be determined with reference to the appended claims, along with the full scope of equivalents to which such claims are entitled. In the appended claims, the terms "including" and "in which" are used as the plain-English equivalents of the respective terms "comprising" and "wherein."

What is claimed is:

1. A film stack comprising:
   a polycrystalline or amorphous substrate;
   an Ion Beam-Assisted Deposition (IBAD) template layer disposed on the substrate; and
   a biaxially-textured film comprising a material with an in-plane texture of less than 2° when measured at a thickness of less than 1 μm,
   wherein the biaxially-textured film is substantially free of twin orientations; and
   wherein the material is germanium.

2. A film stack comprising:
   a polycrystalline or amorphous substrate;
   an Ion Beam-Assisted Deposition (IBAD) template layer disposed on the substrate; and
   a biaxially-textured film comprising a material with an in-plane texture of less than 2° when measured at a thickness of less than 1 μm,
   wherein the biaxially-textured film is substantially free of twin orientations; and
   wherein the material is silicon.

3. A film stack comprising:
   a polycrystalline or amorphous substrate;
   an Ion Beam-Assisted Deposition (IBAD) template layer disposed on the substrate; and
   a biaxially-textured film comprising a material with an in-plane texture of less than 2° when measured at a thickness of less than 1 μm,
   wherein the biaxially-textured film is substantially free of twin orientations; and
   wherein the material is GaAs.

* * * * *